(12) United States Patent
Park et al.

(10) Patent No.: US 11,552,275 B2
(45) Date of Patent: Jan. 10, 2023

(54) ORGANIC LIGHT-EMITTING DISPLAY DEVICE INCLUDING MICROLENSES AND METHOD OF FABRICATING THE SAME

(71) Applicant: LG DISPLAY CO., LTD., Seoul (KR)

(72) Inventors: Hansun Park, Gyeonggi-do (KR); Kangju Lee, Gyeonggi-do (KR); SeungRyong Joung, Gyeonggi-do (KR); Seongsu Jeon, Gyeonggi-do (KR); Wonhoe Koo, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 8 days.

(21) Appl. No.: 17/148,222

(22) Filed: Jan. 13, 2021

(65) Prior Publication Data

US 2021/0135167 A1   May 6, 2021

Related U.S. Application Data

(63) Continuation of application No. 15/339,388, filed on Oct. 31, 2016, now Pat. No. 10,923,684.

(30) Foreign Application Priority Data

Oct. 30, 2015   (KR) .................. 10-2015-0152632

(51) Int. Cl.
*H01L 51/52* (2006.01)
*H01L 27/32* (2006.01)

(52) U.S. Cl.
CPC ...... *H01L 51/5275* (2013.01); *H01L 51/5209* (2013.01); *H01L 51/5225* (2013.01); *H01L 27/3244* (2013.01)

(58) Field of Classification Search
CPC . H01L 27/14627; H01L 27/3244–3246; H01L 51/5275
See application file for complete search history.

(56) References Cited

U.S. PATENT DOCUMENTS

| | | | |
|---|---|---|---|
| 7,903,055 B2 | 3/2011 | Nishikawa | |
| 9,024,305 B2 | 5/2015 | Choi et al. | |
| 9,318,726 B2 | 4/2016 | Choi | |
| 2004/0017153 A1 | 1/2004 | Nishikawa | |
| 2010/0033829 A1 | 2/2010 | Wippermann | |
| 2012/0223873 A1 | 9/2012 | Ohta | |
| 2014/0361270 A1 | 12/2014 | Cui et al. | |
| 2015/0014660 A1 | 1/2015 | Lee | |

(Continued)

FOREIGN PATENT DOCUMENTS

| | | |
|---|---|---|
| CN | 104241543 A | 12/2014 |
| JP | 2011-065773 A | 3/2011 |
| KR | 10-2015-0077261 A | 7/2015 |

*Primary Examiner* — Suberr L Chi
(74) *Attorney, Agent, or Firm* — Dentons US LLP

(57) ABSTRACT

An organic light-emitting display device and a method of fabricating the same. The organic light-emitting display device includes a substrate including a plurality of subpixels and an overcoat layer disposed in light-emitting areas of the plurality of subpixels. The overcoat layer includes microlenses composed of a plurality of concave portions or a plurality of convex portions. Organic electroluminescent devices are disposed on the overcoat layer. At least one subpixel of the plurality of subpixels includes first microlenses and second microlenses of the microlenses, the second microlenses being different from the first microlenses.

20 Claims, 11 Drawing Sheets

(56) References Cited

U.S. PATENT DOCUMENTS

2016/0043145 A1    2/2016  Choi
2017/0062770 A1*  3/2017  Jang .................... H01L 27/3258
2017/0092705 A1*  3/2017  Lim ...................... H01L 27/326

* cited by examiner

ORGANIC LIGHT-EMITTING DISPLAY DEVICE INCLUDING MICROLENSES AND METHOD OF FABRICATING THE SAME

CROSS REFERENCE TO RELATED APPLICATION

This application is a Continuation of U.S. patent application Ser. No. 15/339,388, filed Oct. 31, 2016, which claims priority from Korean Patent Application Number 10-2015-0152632 filed on Oct. 30, 2015, which are hereby incorporated by reference for all purposes as if fully set forth herein.

BACKGROUND

Field

The present disclosure relates to an organic light-emitting display device having uniform luminance and a method of fabricating the same.

Description of Related Art

Organic light-emitting display devices can be fabricated to be relatively light and thin, because they organic electroluminescent elements, which emit light themselves and a separate light source is not required. In addition, organic light-emitting display devices are advantageous in terms of power consumption, because they are driven at low voltages, and also have other desirable qualities, such as the ability to implement a range of colors, rapid response rates, wide viewing angles, and high contrast ratios. Thus, organic light-emitting display devices for next-generation displays have been actively researched.

Light generated by an organic light-emitting layer of an organic light-emitting display device is emitted through several components of the organic light-emitting display device. However, a portion of light generated by the organic light-emitting layer may fail to exit the organic light-emitting display device and may be trapped therein, thereby lowering light extraction efficiency of the organic light-emitting display device.

Particularly, in the case of an organic light-emitting display device having a bottom emission structure, about 50% of light generated by the organic light-emitting layer may be trapped within the organic light-emitting display device through total internal reflection or light absorption by an anode electrode, and about 30% of light generated by the organic light-emitting layer may be trapped within the organic light-emitting display device through total internal reflection or light absorption by a substrate. Thus, as much as about 80% of light generated by the organic light-emitting layer may be trapped within the organic light-emitting display device, and only about 20% of light may be emitted to the outside, leading to poor light extraction efficiency.

An approach of attaching a microlens array (MLA) to an overcoat layer of an organic light-emitting display device has been proposed to improve the light extraction efficiency of organic light-emitting display devices.

Although fabricated under the same conditions, microlens arrays commonly have differences in terms of shape on a micrometer scale. Thus, even when an organic electroluminescent device is fabricated under conditions which should maximize luminous efficiency, the luminance may vary due to differences in the shape of the microlens arrays. Therefore, there is a demand for an approach to overcome this problem.

SUMMARY

The present disclosure provides an organic light-emitting display device able to prevent luminance variations in a light-emitting area (or an emission area) and a method of fabricating the same.

According to an exemplary embodiment of the present disclosure, an organic light-emitting display device may include: a substrate including a plurality of subpixels; an overcoat layer disposed in light-emitting areas of the plurality of subpixels, the overcoat layer including a plurality of microlenses composed of a plurality of concave portions or a plurality of convex portions; and organic electroluminescent devices disposed on the overcoat layer. At least one subpixel of the plurality of subpixels includes a plurality of first microlenses and a plurality of second microlenses, the second microlenses being different from the first microlenses.

In another exemplary embodiment, the first microlenses differ from the second microlenses in at least one feature, for example, the diameter, height, full width at half maximum, aspect ratio of the plurality of concave or convex portions thereof, and a gap between bottoms of adjacent concave or convex portions of the plurality of concave or convex portions thereof.

In another exemplary embodiment, each of the plurality of subpixels may include a single light-emitting area. The single light-emitting area may include a plurality of light-emitting portions. At least two light-emitting portions of the plurality of light-emitting portions may include the first microlenses and the second microlenses, respectively.

In yet another exemplary embodiment, each of the plurality of subpixels may include a single light-emitting area. The single light-emitting area may include a plurality of light-emitting portions. At least one light-emitting portion of the plurality of light-emitting portions may include both the first microlenses and the second microlenses. The at least one subpixel may further include third microlenses different from the first microlenses and the second microlenses.

In another exemplary embodiment of the present disclosure, microlenses having different shapes are disposed in a single emission area to compensate for the process margins of the microlenses, thereby preventing non-uniform luminance in an emission area.

In yet another exemplary embodiment of the present disclosure, a mask for forming microlenses may include different patterns, such that different microlenses can be formed in a single emission area.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION

Figure 1:
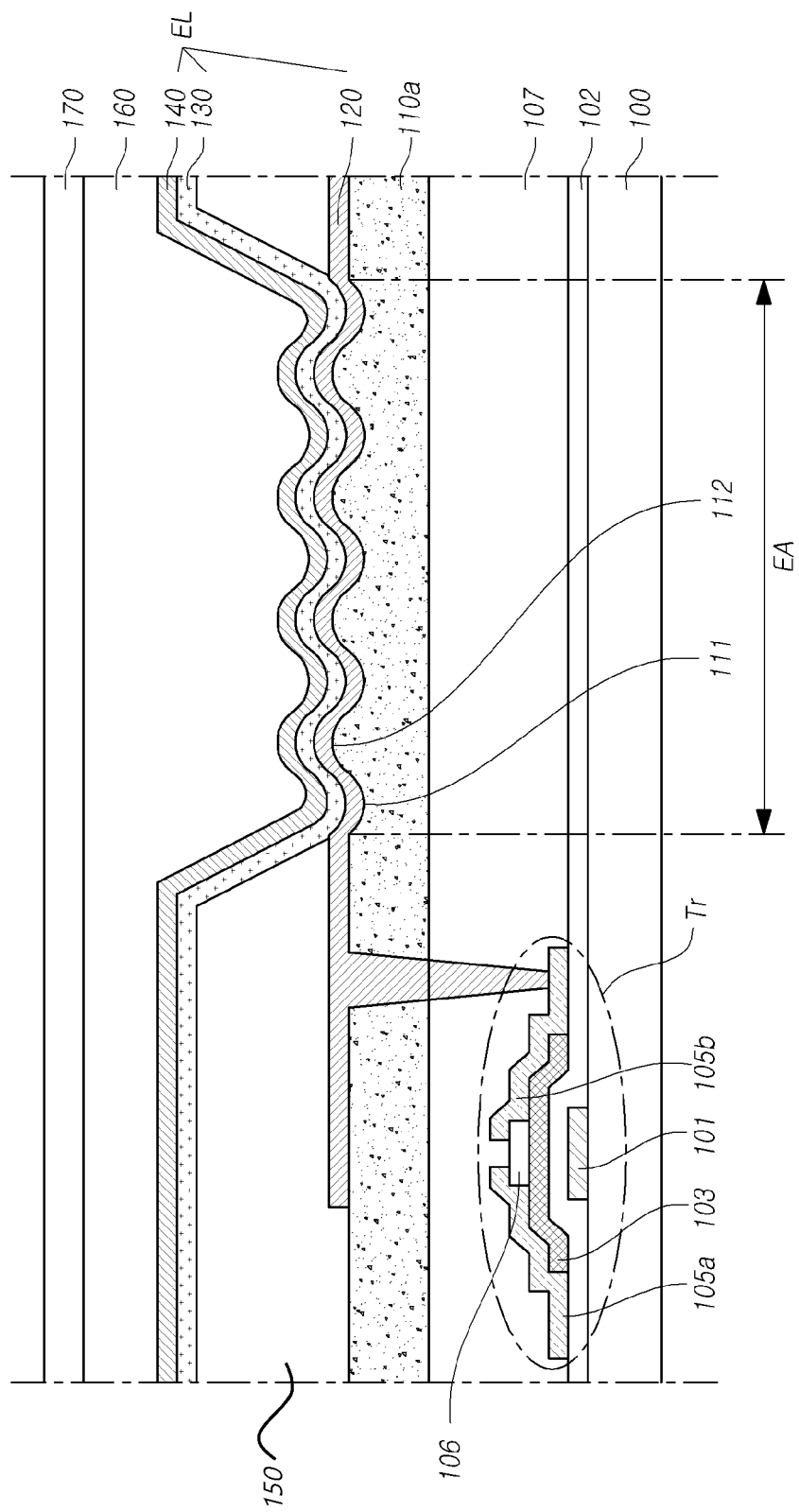
FIG. 1 is a cross-sectional view illustrating an organic light-emitting display device according to exemplary embodiments of the present disclosure.

Reference will now be made in detail to various embodiments of the present disclosure, examples of which are illustrated in the accompanying drawings. The advantages and features of the present disclosure and methods of the realization thereof will be apparent with reference from the accompanying drawings and detailed descriptions of the embodiments. The embodiments set forth herein are provided for illustrative purposes to fully convey the concept of the present disclosure to a person skilled in the art. The present disclosure should not be construed as being limited to these embodiments and may be embodied in many different forms. In the drawings, the size and thickness of the device may be exaggerated for the sake of clarity. Throughout this document, the same reference numerals and signs will be used to designate the same or like components.

The advantages and features of the present disclosure and methods of the realization thereof will be apparent with reference from the accompanying drawings and detailed descriptions of the embodiments.

It will be understood that when an element or a layer is referred to as being "on" another element or layer, not only can it be "directly on" the other element or layer, but it can also be "indirectly on" the other element or layer via an "intervening" element or layer. In contrast, when an element or a layer is referred to as being "directly on" another element or layer, it will be understood that no intervening element or layer is interposed.

Spatially relative terms such as "below," "beneath," "under," "lower," "above," and "upper" may be used herein for the ease of description of the relationship of an element or components to another element or other components as illustrated in the drawings. The spatially relative terms should be construed as terms encompassing different orientations of the element in use or operation in addition to the orientation depicted in the drawings. For example, when elements illustrated in the drawings are turned over, an element described as "below," "beneath," or "under" another element would then be oriented "above" the other element. Thus, the example term "below," "beneath," or "under" can encompass both orientations of above and below, and vice versa.

In addition, terms such as "first," "second," "A," "B," "(a)," and "(b)" may be used herein to describe various components. It should be understood, however, that these terms are only used to distinguish one component from another component and the type, order, sequence, or number of the components is not limited by these terms.

Further, according to an exemplary embodiment of the present disclosure, a pixel includes one or more subpixels. For example, a single pixel may include two to four subpixels. The term "subpixel" refers to a unit in which a specific type of color filter layer is formed or a unit in which an electroluminescent device can generate a specific color of light without a color filter layer. Colors defined in the subpixel may include red (R), green (G), blue (B), and selectively, white (W), but the present disclosure is not limited thereto.

FIG. 1 is a cross-sectional view illustrating an organic light-emitting display device according to exemplary embodiments of the present disclosure. Referring to FIG. 1, the organic light-emitting display device includes a thin-film transistor Tr and an electroluminescent device EL electrically connected to the thin-film transistor Tr.

In FIG. 1, a gate electrode 101 and a gate insulating film 102 of the thin-film transistor Tr are disposed on a first substrate 100. An active layer 103 is disposed on the gate insulating film 102 to overlap the gate electrode 101. An etch stop layer 106 is disposed on the active layer 103 to protect a channel area of the active layer 103.

A source electrode 105a and drain electrode 105b are disposed on the active layer 103 to be in contact therewith. A protective layer 107 is disposed on the source electrode 105a and drain electrode 105b. The organic light-emitting display device of the present disclosure is not limited to the organic light-emitting display device illustrated in FIG. 2, and a buffer layer sandwiched between the first substrate 100 and the active layer 103 may be further provided.

In addition, an overcoat layer 110a is disposed on the protective layer 107. 60% to 70% of light generated is trapped in the overcoat layer 110a by a surface plasmon component (or surface plasmon polariton (SPP)) formed at a metal/organic interface and an optical waveguide mode formed by an organic layer sandwiched between a pair of reflective layers. Thus, it is necessary to extract the light trapped within the organic light-emitting layer 130 from the display device.

To overcome this problem, the overcoat layer 110a of the organic light-emitting display device according to exemplary embodiments of the present disclosure includes a plurality of concave portions 111 and a plurality of connecting portions 112 respectively connecting adjacent concave portions 111. The plurality of concave portions 111 and the connecting portions 112 are disposed in locations corresponding to emission areas (or light-emitting areas) EA of subpixels. The emission areas EA are areas in which the organic light-emitting layer 130 generates light in conjunction with a first electrode 120 and a second electrode 140. Such an arrangement improves light extraction efficiency.

However, although fabricated under the same conditions, microlenses disposed in an emission area EA included in a single subpixel may have different shapes. Thus, the organic electroluminescent device EL disposed on the microlenses may differ in different portions of the emission area EA. That is, a single subpixel may have variations in luminance in the portions corresponding to the microlenses having different shapes.

Although FIG. 1 illustrates a configuration in which microlenses disposed on the overcoat layer 110a include a plurality of concave portions 111 and a plurality of connecting portions 112, the organic light-emitting display device of the present disclosure is not limited thereto. Microlenses including a plurality of convex portions and connecting portions may be used. Hereinafter, the microlenses will be described as including the plurality of concave portions 111 and the plurality of connecting portions 112 for brevity.

The first electrode 120 of the electroluminescent device EL connected to the drain electrode 105b of the thin-film transistor Tr is disposed on the overcoat layer 110a. A bank pattern 150 is disposed on the overcoat layer 110a such that a portion of the top surface of the first electrode 120 is exposed. The organic light-emitting layer 130 is disposed on the bank pattern 150 and the top surface of the first electrode 120 exposed through the bank pattern 150.

The organic light-emitting layer 130 may only be disposed on the top surface of the first electrode 120 exposed through the bank pattern 150 or may be disposed to cover the top portions of the first electrode 120 and the bank pattern 150. The second electrode 140 of the organic electroluminescent device EL is disposed to overlap the organic light-emitting layer 130 and the bank pattern 150.

An encapsulation layer 160 is disposed on the second electrode to protect the organic electroluminescent device EL from moisture and air. Although the encapsulation layer 160 is illustrated as a single layer in FIG. 1, exemplary embodiments of the present disclosure are not limited thereto. Rather, the encapsulation layer 160 may be formed as a multilayer structure. A second substrate 170 is disposed on the encapsulation layer 160.

Although the electroluminescent device EL is illustrated as being a bottom-emission type organic light-emitting display device in FIG. 1, exemplary embodiments may be applied to top-emission and dual-emission type organic light-emitting display devices as required.

When exemplary embodiments of the present disclosure are applied to a bottom-emission type electroluminescent device, a color filter layer may be disposed on the protective layer 107. The color filter layer may be disposed on each of a plurality of subpixels or may be disposed on predetermined subpixels of the plurality of subpixels.

The color filter layer may be disposed in a location corresponding to the emission area of each subpixel. The emission area is an area in which the organic light-emitting layer 130 generates light in conjunction with the first electrode 120 and the second electrode 140. The color filter layer disposed in the location corresponding to the emission area prevents light generated by adjacent emission areas from mixing, thereby preventing image blurring or ghosting.

In this exemplary embodiment, light striking the boundary between each microlens and the first electrode 120 at an angle of incidence equal to or less than a critical angle for total internal reflection is reflected by the reflective layer and is extracted to the outside of the second substrate 170. In contrast, incident light having an angle of incidence greater than the critical angle for total internal reflection is not trapped within the organic electroluminescent device EL but strikes the microlenses so that the path thereof is changed, ultimately causing the angle of propagation of incident light to become less than the critical angle for total internal reflection, whereby the incident light can be extracted to the outside of the second substrate 170.

However, although fabricated under the same conditions, microlenses disposed in an emission area EA included in a single subpixel may have different shapes. Thus, the organic electroluminescent device EL disposed on the microlenses may differ in different portions of the emission area EA. That is, a single subpixel may have variations in luminance in the portions corresponding to the microlenses having different shapes.

To solve this problem, in the organic light-emitting display device according to exemplary embodiments of the present disclosure, at least one subpixel includes a plurality of first microlenses and a plurality of second microlenses, and the shape of the first microlenses may differ from the shape of the second microlenses, such that the emission area EA included in each subpixel provided with the microlenses has uniform luminance.

Figure 2:
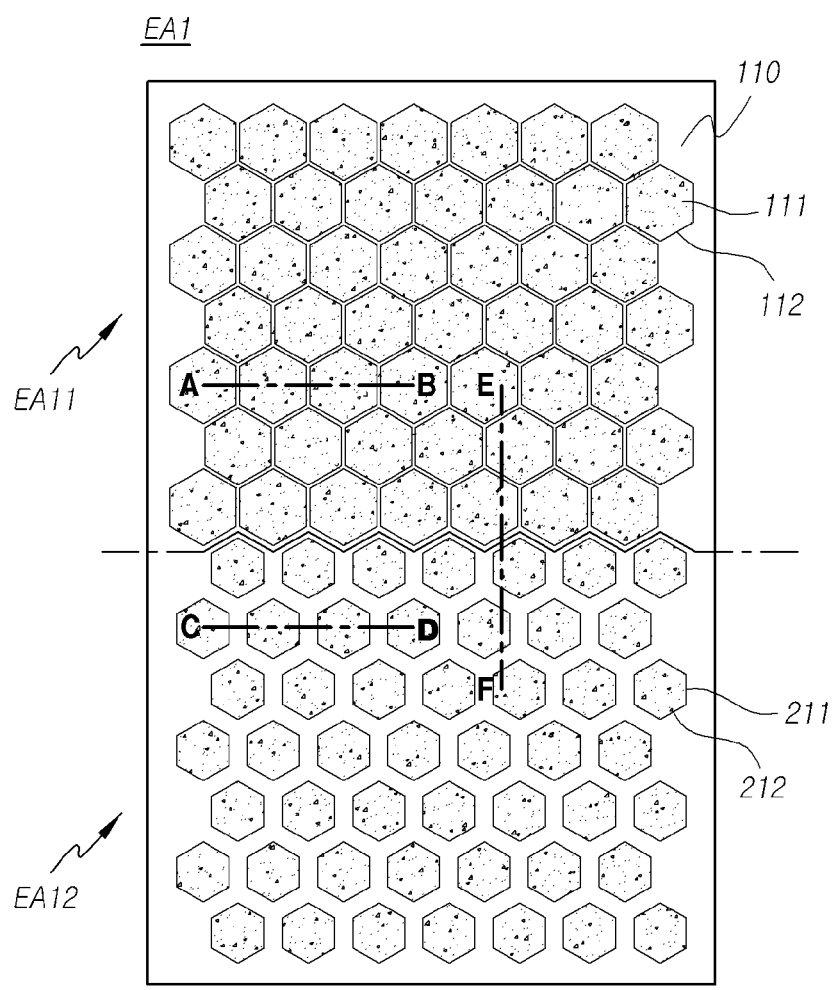
FIG. 2 is a plan view illustrating an emission area of an organic light-emitting display device according to a first exemplary embodiment.

Hereinafter, this configuration will be described with reference to FIG. 2. FIG. 2 is a plan view illustrating an emission area of an organic light-emitting display device according to a first exemplary embodiment.

Referring to FIG. 2, the organic light-emitting display device according to the first exemplary embodiment includes a plurality of subpixels, in each of which an overcoat layer 110 including microlenses is disposed. The microlenses may include a plurality of concave portions or a plurality of convex portions. In the following description, a configuration in which the microlenses include a plurality of concave portions and a plurality of connecting portions will be discussed for brevity.

Specifically, in the first exemplary embodiment of the present disclosure, a single subpixel of the organic light-emitting display device includes a single emission area EA1. The single emission area EA1 includes a plurality of emission portions (or light-emitting portions). FIG. 2 illustrates a configuration in which the emission area EA1 includes a first emission portion EA11 and a second emission portion EA12.

The first emission portion EA11 includes a plurality of first microlenses and the second emission portion EA12 includes a plurality of second microlenses. The first microlenses include a plurality of first concave portions 111 and a plurality of first connecting portions 112 connecting adjacent first concave portions 111. In addition, the plurality of second microlenses include a plurality of second concave portions 211 and a plurality of second connecting portions 212 connecting adjacent second connecting portions 211.

Although the shape of the microlenses is illustrated as being hexagonal in FIG. 2, the first exemplary embodiment is not limited thereto, and the microlenses may have a variety of shapes, such as a circular shape or an elliptical shape.

The first microlenses may be different from the second microlenses. The differences will be discussed with reference to FIG. 3 to FIG. 7.

Figure 3:
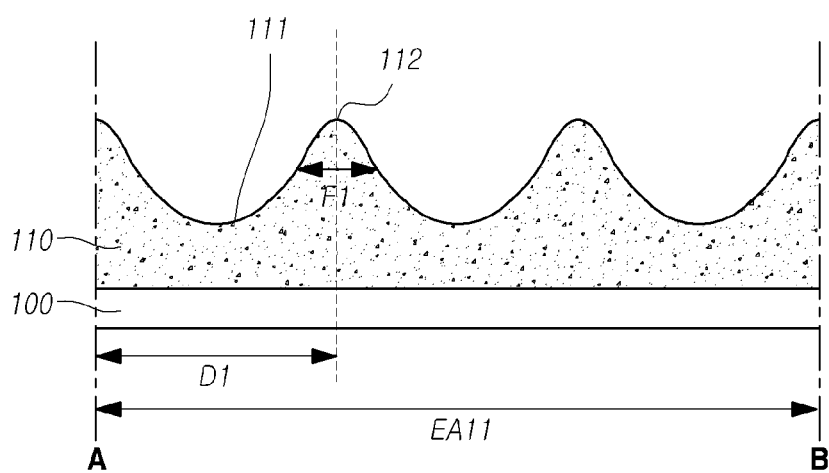
FIG. 3 is a cross-sectional view along line A-B of the emission area of the organic light emitting display device illustrated in FIG. 2.
Figure 4:
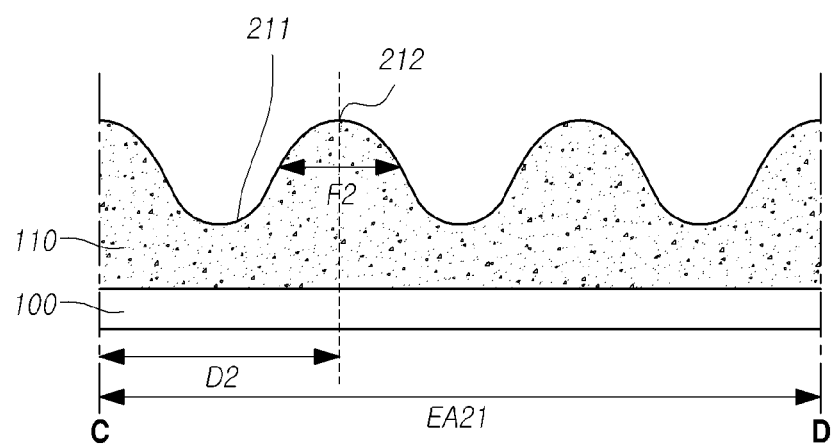
FIG. 4 is a cross-sectional view along line C-D of the emission area of the organic light emitting display device illustrated in FIG. 2.

FIG. 3 is a cross-sectional view along line A-B of the emission area of the organic light emitting display device illustrated in FIG. 2, and FIG. 4 is a cross-sectional view along line C-D of the emission area of the organic light emitting display device illustrated in FIG. 2.

FIG. 3 illustrates the first emission portion EA11 of the emission area EA1 of the organic light-emitting display device according to the first exemplary embodiment. The first emission portion EA11 of the organic light-emitting display device according to the first exemplary embodiment is disposed on the substrate 100 and includes a portion of the overcoat layer 110 on which first microlenses are formed.

The first microlenses include a plurality of first concave portions 111 and a plurality of first connecting portions 112.

FIG. 4 illustrates the second emission portion EA12 of the emission area EA1 of the organic light-emitting display device according to the first exemplary embodiment. The second emission portion EA12 of the organic light-emitting display device according to the first exemplary embodiment is disposed on the substrate 100 and includes another portion of the overcoat layer 110 on which second microlenses are formed. The second microlenses include a plurality of second concave portions 211 and a plurality of second connecting portions 212.

The first microlenses and the second microlenses may be different from each other. Specifically, at least one feature of the first and second microlenseses, such as the diameter D, height H, full width at half maximum (FWHM), aspect ratio of the concave or convex portions, and a gap (or distance) between the bottoms of the adjacent concave or convex portions may be different.

The diameter D is the length between the centers of two adjacent concave portions, the height H is the length from the bottom of the concave portions to the top of the connecting portions, the full width at half maximum (FWHM) is the length between two concave portions at half of the maximum height; and the aspect ratio of the concave portions is a value obtained by dividing the height H of the concave portions by the radius D/2 of the concave portions.

The shape of the concave or convex portions of the microlenses employed to improve light extraction efficiency can change the optical path of light generated by the light-emitting layer of the organic electroluminescent device. Thus, the shape of the concave or convex portions of the microlenses may be a major factor in improving light extraction efficiency.

In FIG. 3 and FIG. 4, the first full width at half maximum F1 of the first concave portions 111 of the first microlenses disposed in the first emission portion EA11 is smaller than the second full width at half maximum F2 of the second concave portions 211 of the second microlenses disposed in the second emission portion EA12. The full width at half maximum F1 of the first concave portions 111, which is smaller than the full width at half maximum F2 of the second concave portions 211, thereby indicating that the shape of the first microlenses is different from the shape of the second microlenses.

In other words, in the single emission area EA1 of the organic light-emitting display device according to the first exemplary embodiment, the first microlenses have a different shape from the second microlenses. The full width at half maximum F1 of the first microlenses being smaller than the full width at half maximum F2 of the second microlenses indicates that the shape of the first concave portions 111 is narrower than the shape of the second concave portions 211. Here, since the shape of the side surfaces of the first concave portions 111 is narrower than the shape of the side surfaces of the second concave portions 211, the length of lateral optical paths is reduced, thereby improving external light extraction efficiency.

The shape of the first microlenses and the shape of the second microlenses according to the first exemplary embodiment are not limited thereto, and the diameter D1 of the first concave portions 111 may also differ from the diameter D2 of the second concave portions 211.

Either the first diameter D1 of the first concave portions 111 or the second diameter D2 of the second concave portions 211 may be in the range of 4.0 μm to 4.5 μm. When both the first diameter D1 and the second diameter D2 is smaller than 4.0 μm or is greater than 4.5 μm, the intensity of light that is reflected from one wall to another wall of the first concave portions 111 or the second concave portions 211 is reduced. Consequently, the ability of the microlenses to extract light generated by the organic electroluminescent device externally may be reduced.

In addition, since the first diameter D1 of the first concave portions 111 is different from the second diameter D2 of the second concave portions 211, the aspect ratio (A/R) of the first concave portions 111 may also differ from the aspect ratio (A/R) of the second concave portions 211. Either the aspect ratio of the first concave portions 111 or the aspect ratio of second concave portions 211 may be in the range of 0.45 to 0.7.

When the aspect ratio of the first concave portions 111 and the aspect ratio of second concave portions 211 is less than 0.45 or is greater than 0.7, the luminous efficiency of light generated by the organic electroluminescent device may be lowered. Specifically, when the aspect ratio of the first concave portions 111 and the aspect ratio of second concave portions 211 is less than 0.45, the height of the first concave portions 111 and the second concave portions 211 is significantly low in relation to the radius thereof, such that the slope of either the first concave portions 111 or the second concave portions 211 becomes significantly gradual. Thus, when light is generated by the organic electroluminescent device, the intensity of light extracted through the side surfaces may be greater than the intensity of light extracted through the front surface through the concave portions 111 and 211, thereby lowering light extraction efficiency.

When the aspect ratio of the first concave portions 111 and the aspect ratio of second concave portions 211 is greater than 0.7, the slope of the first concave portions 111 and the second concave portions 211 becomes significantly steep. This consequently reduces the phenomenon in which light that has entered through one wall of either the first concave portions 111 or the second concave portions 211 arrives at another wall of either the first concave portions 111 or the second concave portions 211 and is then reflected forwardly therefrom, thereby reducing the intensity of the extracted light.

Since the shape of the first microlenses disposed in the second emission portion EA12 is different from the shape of the second microlenses disposed in the second emission portion EA12, the second emission portion EA12 and the second emission portion EA12 of the organic electroluminescent device have different luminous efficiencies, thereby allowing different intensities of light to be extracted from the display device. As described above, the luminous efficiency and light extraction efficiency of the organic electroluminescent device due to the microlenses within the single emission area EA1 can be compensated using the microlenses having different shapes, thereby preventing variations in luminance within the single emission area EA1.

Further, the first microlenses and the second microlenses illustrated in FIG. 3 and FIG. 4 disclose a configuration in which there are no gaps between two adjacent concave portions. In the organic light-emitting display device illustrated in FIG. 3 and FIG. 4, outgassing caused by the color filter layer exposed by the first and second concave portions 111 and 211 of the overcoat layer 110 can be prevented by including a color filter layer disposed below the overcoat layer 110.

FIG. 3 and FIG. 4 illustrate a configuration in which the first diameter D1 of the first concave portions 111 differs from the second diameter D2 of the second concave portions 211, and the different diameters D1 and D2 cause the aspect ratio of the first concave portions 111 to differ from the aspect ratio of the second concave portions 211. However, the organic light-emitting display device according to the first exemplary embodiment is not limited thereto, and other configurations, such as a configuration in which the height H of the first concave portions 111 differs from the height H of the second concave portions 211, may be used.

Figure 5:
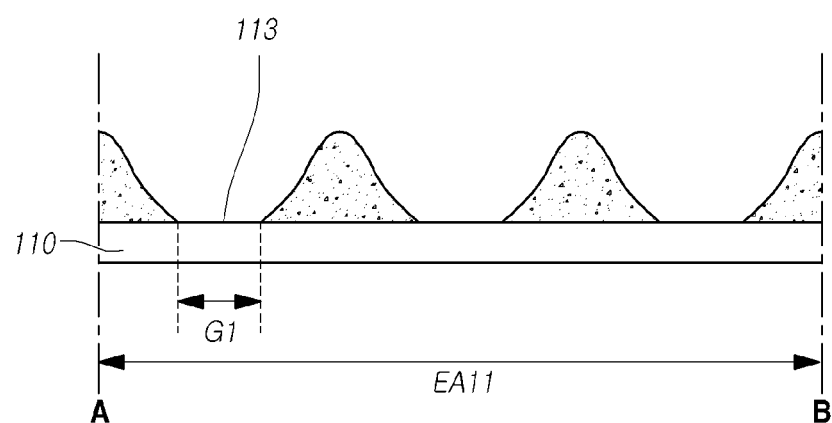
FIG. 5 is a cross-sectional view illustrating first microlenses having a different shape in the organic light-emitting display device according to the first exemplary embodiment.
Figure 6:
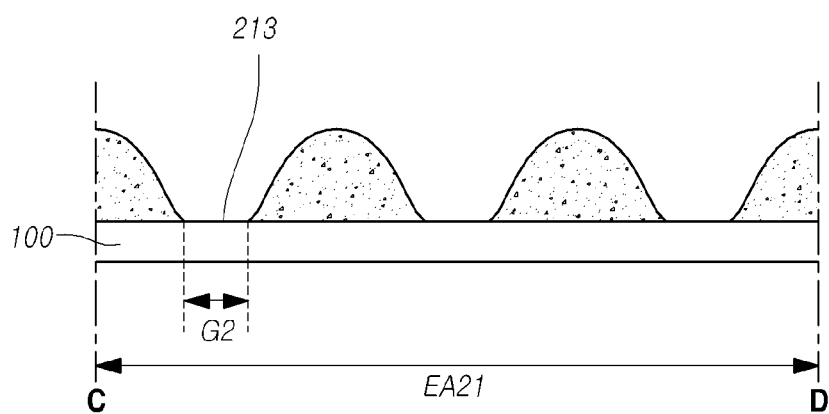
FIG. 6 is a cross-sectional view illustrating second microlenses having a different shape in the organic light-emitting display device according to the first exemplary embodiment.

The organic light-emitting display device according to the first exemplary embodiment is not limited to the foregoing configuration and may have a different configuration, as illustrated in FIG. 5 and FIG. 6. FIG. 5 is a cross-sectional view illustrating first microlenses having a different shape in the organic light-emitting display device according to the first exemplary embodiment, while FIG. 6 is a cross-sectional view illustrating second microlenses having a different shape in the organic light-emitting display device according to the first exemplary embodiment.

As illustrated in FIG. 5 and FIG. 6, in the organic light-emitting display device according to the first exemplary embodiment, either the first microlenses or the second microlenses have gaps between the bottoms of adjacent concave portions.

First gaps G1 between the bottoms of the adjacent first concave portions 111 of the first microlenses disposed in the second emission portion EA11 are greater than second gaps G2 between the bottoms of the adjacent second concave portions 211 of the second microlenses disposed in the second emission portion EA12.

Here, a gap greater than zero indicates that two adjacent concave portions are separated from each other. The gaps may or may not be formed depending on the conditions at which the microlens are processed. For example, the presence of the gaps in the microlenses may be determined depending on the material of the overcoat layer, the intensity of light to which the overcoat layer is exposed, and the like.

Figure 7:
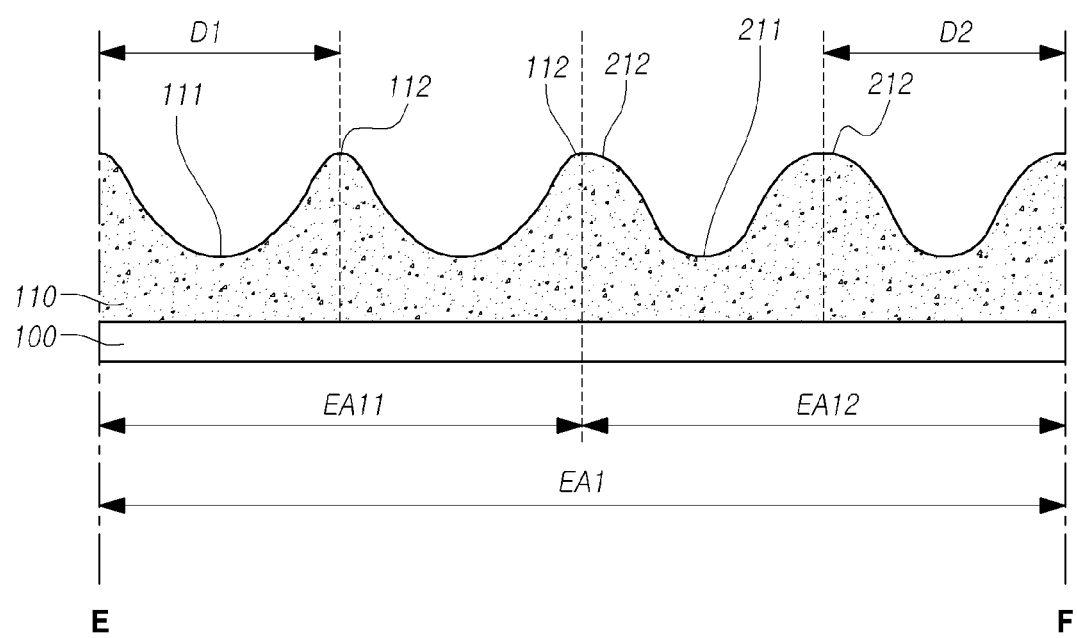
FIG. 7 is a cross-sectional view along line E-F of an emission area of the organic light emitting display device illustrated in FIG. 2.

Hereinafter, the cross-sections of the first and second emission portions of the organic light-emitting display device according to the first exemplary embodiment will be described. FIG. 7 is a cross-sectional view along line E-F of the organic light-emitting display device illustrated in FIG. 2.

Referring to FIG. 7, the emission area EA1 of the organic light-emitting display device according to the first exemplary embodiment includes a first emission portion EA11 and a second emission portion EA12. In addition, the first emission portion EA11 and the second emission portion EA12 include first microlenses and second microlenses, respectively.

In FIG. 7, the second connecting portions 212 of the second microlens connected to the first connecting portions 112 of the first microlens are disposed at the boundary between the first emission portion EA11 and the second emission portion EA12. Thus, the first concave portions 111 and the second concave portions 211 are not adjacent to each other at the boundary between the first emission portion EA11 and the second emission portion EA12.

The slopes of the first and second concave portions 111 and 211 form effective emission areas in which the luminous efficiency of the organic electroluminescent device is higher than in areas other than the slopes. However, when there is a gap between the concave portions 111 and 211, the effective emission areas may be reduced. However, the effective emission areas of the concave portions 111 and 211 can be increased in this configuration.

The organic light-emitting display device according to the first exemplary embodiment is not limited thereto, and the second concave portions 211 of the second microlenses extending from the first concave portions 111 of the first microlenses may be disposed at a boundary between the first emission portion EA11 and the second emission portion EA12.

Since different types of microlenses are disposed in the single emission area as described above, the process margins of the microlenses can be compensated, thereby preventing or reducing non-uniform luminance in the single emission area.

Hereinafter, an organic light-emitting display device according to a second exemplary embodiment will be described with reference to FIG. 8, which is a plan view illustrating the emission area of the organic light-emitting display device according to the second exemplary embodiment.

The organic light-emitting display device according to the second exemplary embodiment may include the same components as those of the foregoing embodiment. Descriptions of components in common with other embodiments will be omitted for brevity. In addition, the same reference numerals or signs will be used to designate the same or like components in each of the embodiments.

Figure 8:
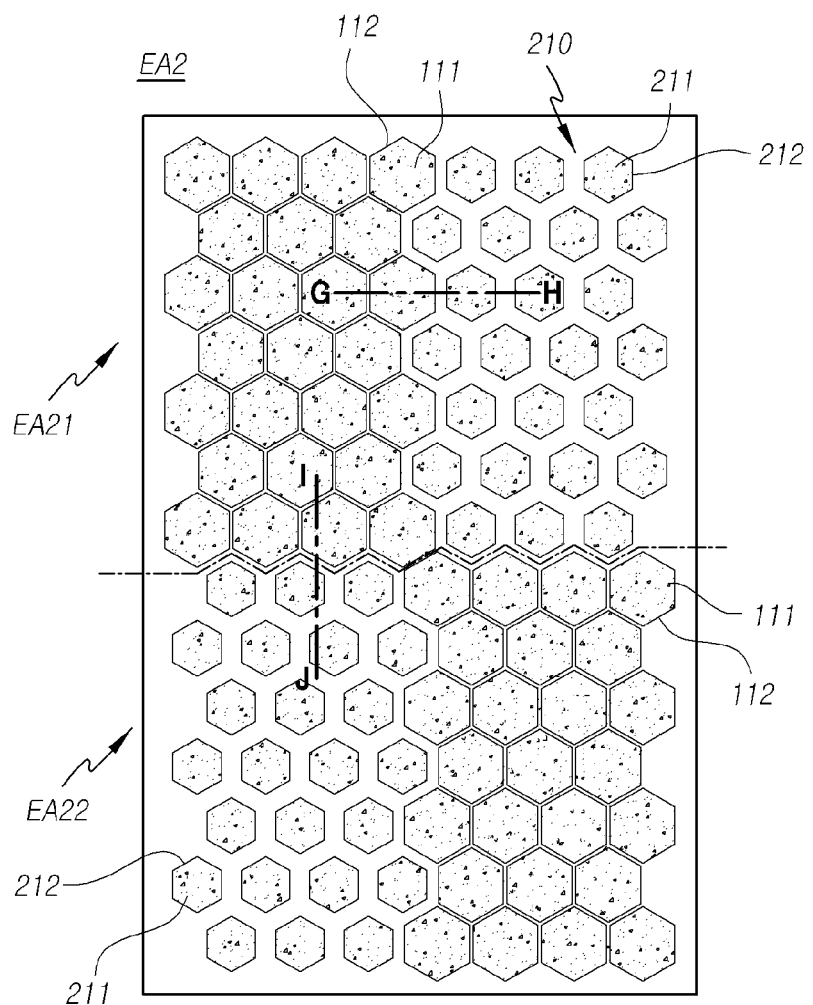
FIG. 8 is a plan view illustrating an emission area of an organic light-emitting display device according to a second exemplary embodiment.

Referring to FIG. 8, the organic light-emitting display device according to the second exemplary embodiment includes a plurality of subpixels, each of which includes an emission area EA2. Here, a single emission area EA2 includes a first emission portion EA21 and a second emission portion EA22.

Although FIG. 8 illustrates a configuration in which the first emission portion EA21 is disposed above the second emission portion EA22, the organic light-emitting display device according to the second exemplary embodiment is not limited thereto, and the second emission portion EA22 may be disposed above the first emission portion EA21 instead.

Here, each of the first emission portion EA21 and the second emission portion EA22 includes a first microlens area and a second microlens area. A plurality of first concave portions 111 and a plurality of first connecting portions 112 are disposed in the first microlens area, and a plurality of second concave portions 211 and a plurality of second connecting portions 212 are disposed in the second microlens area.

A group of first microlenses are disposed in a predetermined area of the first emission portion EA21, and a group of second microlenses are disposed in the remaining area of the first emission portion EA21. In addition, another group of first microlenses are disposed in a predetermined area of the second emission portion EA22, and another group of second microlenses are disposed in the remaining area of the second emission portion EA22.

Here, the cross-section of the first emission portion EA21 along line G-H and the cross-section of the first emission portion EA21 and the second emission portion EA21 along line I-J may be the same as the cross-section illustrated in FIG. 7.

Since each of the first emission portion EA21 and the second emission portion EA22 includes a first microlens area and a second microlens area, the process margins of the microlenses can be compensated, thereby preventing or reducing non-uniform luminance.

Hereinafter, an organic light-emitting display device according to a third exemplary embodiment will be described with reference to FIG. 9, which is a plan view illustrating the emission area of the organic light-emitting display device according to the third exemplary embodiment.

The organic light-emitting display device according to the third exemplary embodiment may include the same components as those of the foregoing embodiment. Descriptions of components in common with other embodiments will be omitted for brevity. In addition, the same reference numerals or signs will be used to designate the same or like components in each of the embodiments.

Figure 9:
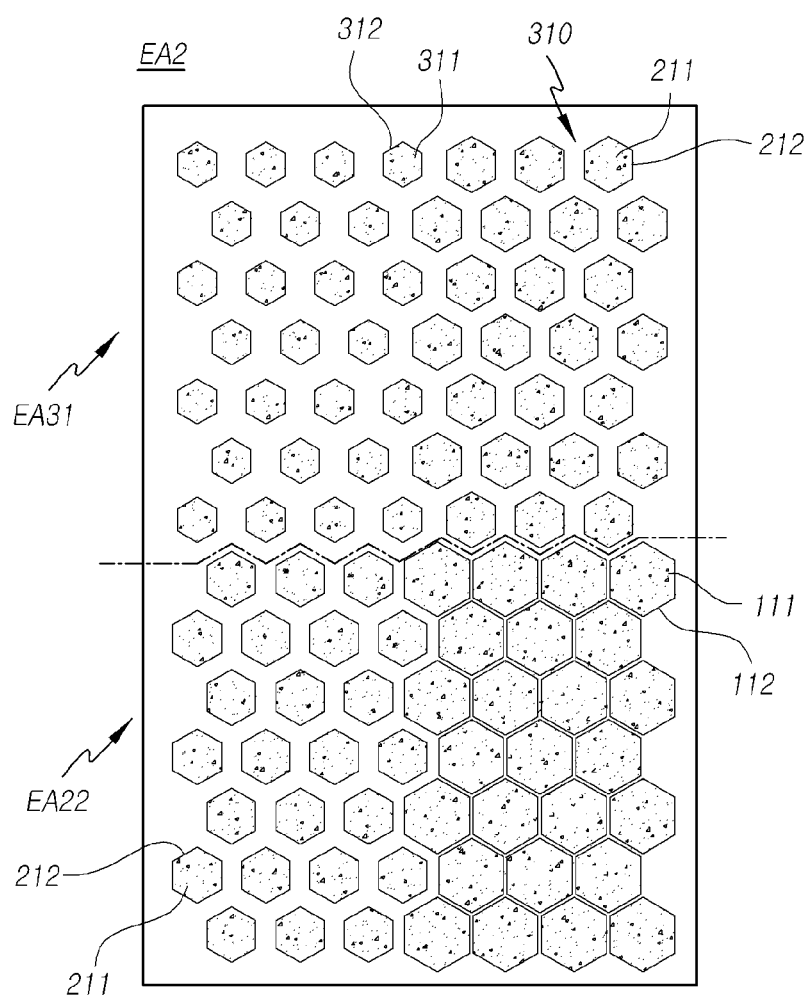
FIG. 9 is a plan view illustrating an emission area of an organic light-emitting display device according to a third exemplary embodiment.

Referring to FIG. 9, the organic light-emitting display device according to the third exemplary embodiment includes a plurality of subpixels, each of which includes an emission area EA3. The emission area EA3 includes a first emission portion EA31 and a second emission portion EA32.

Although FIG. 9 illustrates a configuration in which the first emission portion EA31 is disposed above the second emission portion EA32, the organic light-emitting display device according to the third exemplary embodiment is not limited thereto, and the second emission portion EA32 may be disposed above the first emission portion EA31 instead.

Here, the first emission portion EA31 includes a third microlens area in which a plurality of third concave portions 311 and a plurality of third connecting portions 312 are disposed and a second microlens area in which a plurality of second concave portions 211 and a plurality of second connecting portions 212 are disposed. The second emission portion EA32 includes a first microlens area in which a plurality of first concave portions 111 and a plurality of first connecting portions 112 are disposed and a second microlens area in which another plurality of second concave portions 211 and another plurality of second connecting portions 212 are disposed.

A group of third microlenses are disposed in a predetermined area of the first emission portion EA31, and a group of second microlenses are disposed in the remaining area of the first emission portion EA31. In addition, a group of first microlenses are disposed in a predetermined area of the second emission portion EA32, and another group of second microlenses are disposed in the remaining area of the second emission portion EA32.

The third microlenses are different from the first microlenses and the second microlenses. Specifically, at least one aspect of the third micrometers, such as the diameter D, height H, full width at half maximum (FWHM), aspect ratio of the concave portions 311, and the gap between the bottoms of the adjacent concave portions 311, may differ from the corresponding aspect of the first microlenses and the second microlenses.

Since the single emission area EA3 includes three types of microlenses having different shapes as described above, the different microlens shapes can compensate for the luminous efficiency of the organic electroluminescent device and the light extraction efficiency of the microlenses, thereby preventing non-uniform luminance in the single emission area EA3.

Although FIG. 8 and FIG. 9 illustrate configurations in which each of the first emission portions EA21 and EA31 and the second emission portions EA22 and EA32 includes two different types of microlens areas, the organic light-emitting display device according to the present disclosure is not limited thereto, and any configurations in which each emission area includes two or more types of microlens areas may be used.

In addition, although FIG. 8 and FIG. 9 illustrate configurations in which each of the single emission areas EA2 and EA3 includes two emission portions, the organic light-emitting display device according to the present disclosure is not limited thereto, and any configurations in which each of the single emission areas EA2 and EA3 includes two or more emission portions may be used.

In the above-described configurations, the microlenses are formed on the overcoat layer in the emission areas by a process, such as photolithography, using a mask. It is possible to control the shape of concave portions in the overcoat layer by adjusting the material of the overcoat layer or the intensity of light.

Hereinafter, exemplary masks used in forming microlenses in an overcoat layer will be described with reference to FIG. 10 and FIG. 11. Each of the masks illustrated in FIG. 10 and FIG. 11 corresponds to an emission area of a single subpixel.

Figure 10:
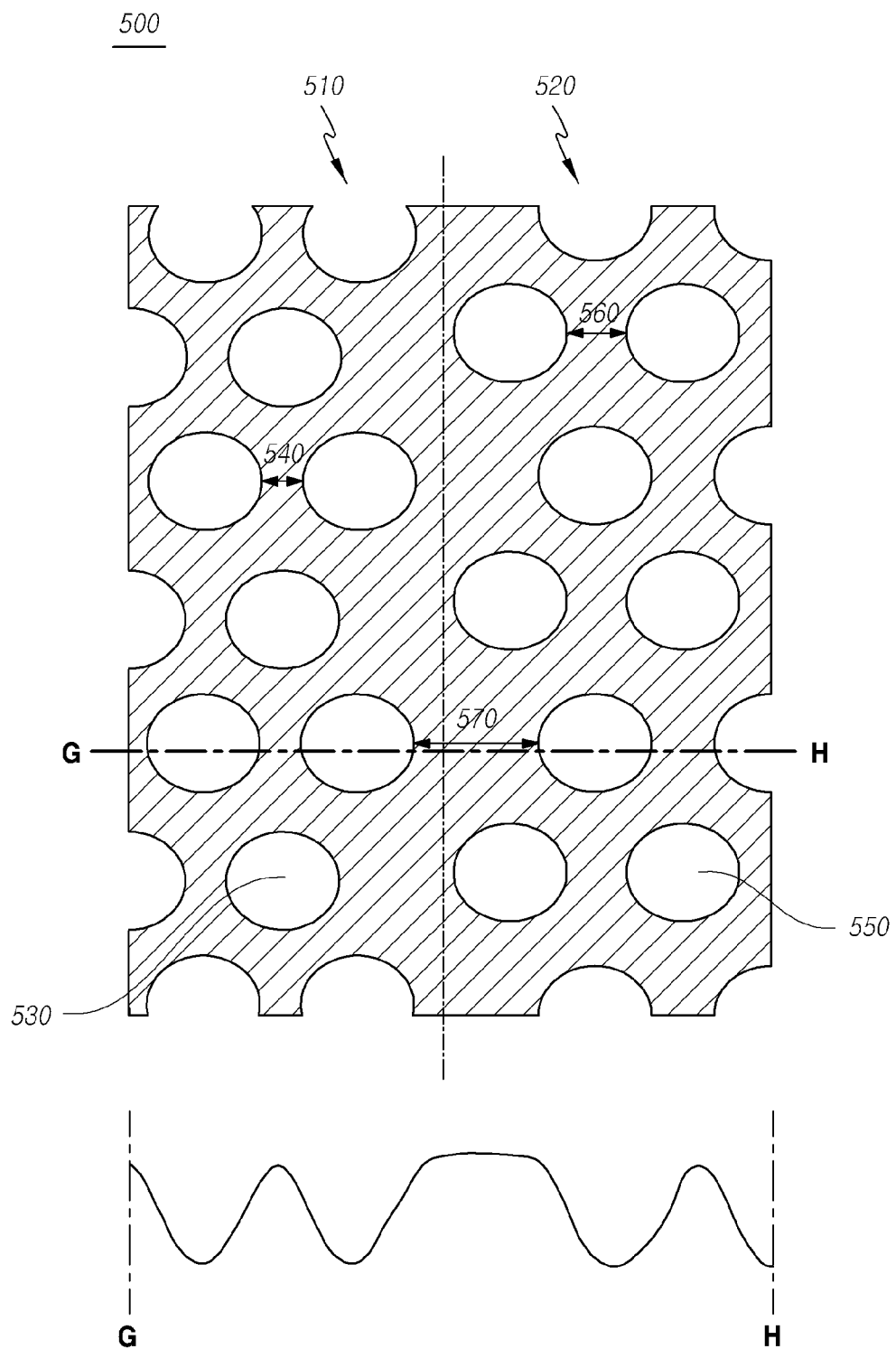
FIG. 10 illustrates a mask for forming microlenses according to a first exemplary embodiment.

Referring to FIG. 10, the mask 500 according to the first exemplary embodiment is divided into a first area 510 and a second area 520. The first area 510 includes a plurality of first pattern 530, while the second area 520 includes a plurality of second patterns 550.

First gaps 540 between adjacent first patterns 530 in the first area 510 may be smaller than second gaps 560 between adjacent second patterns 550 in the second area 520.

First microlenses are formed on a portion of an overcoat layer disposed to correspond to the first area 510 of the mask 500, while second microlenses are formed on another portion of the overcoat layer disposed to correspond to the second area 520 of the mask 500.

Neither the first patterns 530 nor the second patterns 550 are disposed at a boundary area 570 between the first area 510 and the second area 520. For example, portions of the material of the overcoat layer are developed and removed when irradiated with light to form the first patterns 530 and the second patterns 550 of the mask 500 as open areas, and connecting portions of microlenses can be formed on the portions of the overcoat disposed to correspond to the boundary area 570 between the first area 510 and the second area 520 of the mask 500 (see the cross-section along line G-H in FIG. 10). In addition, the first gaps 540 are formed in a different manner than that used to form the second gaps 560, whereby different connecting portions can be formed on the microlenses.

The mask according to the first exemplary embodiment is not limited thereto, and the diameter of the first patterns 530 may differ from the diameter of the second patterns 550. Since the first patterns 530 are formed differently to the second patterns 550, the shape of the microlenses formed on the portion of the overcoat layer corresponding to the first area 510 of the mask differs from the shape of the microlenses formed on the portion of the overcoat layer corresponding to the second area 520 of the mask.

Figure 11:
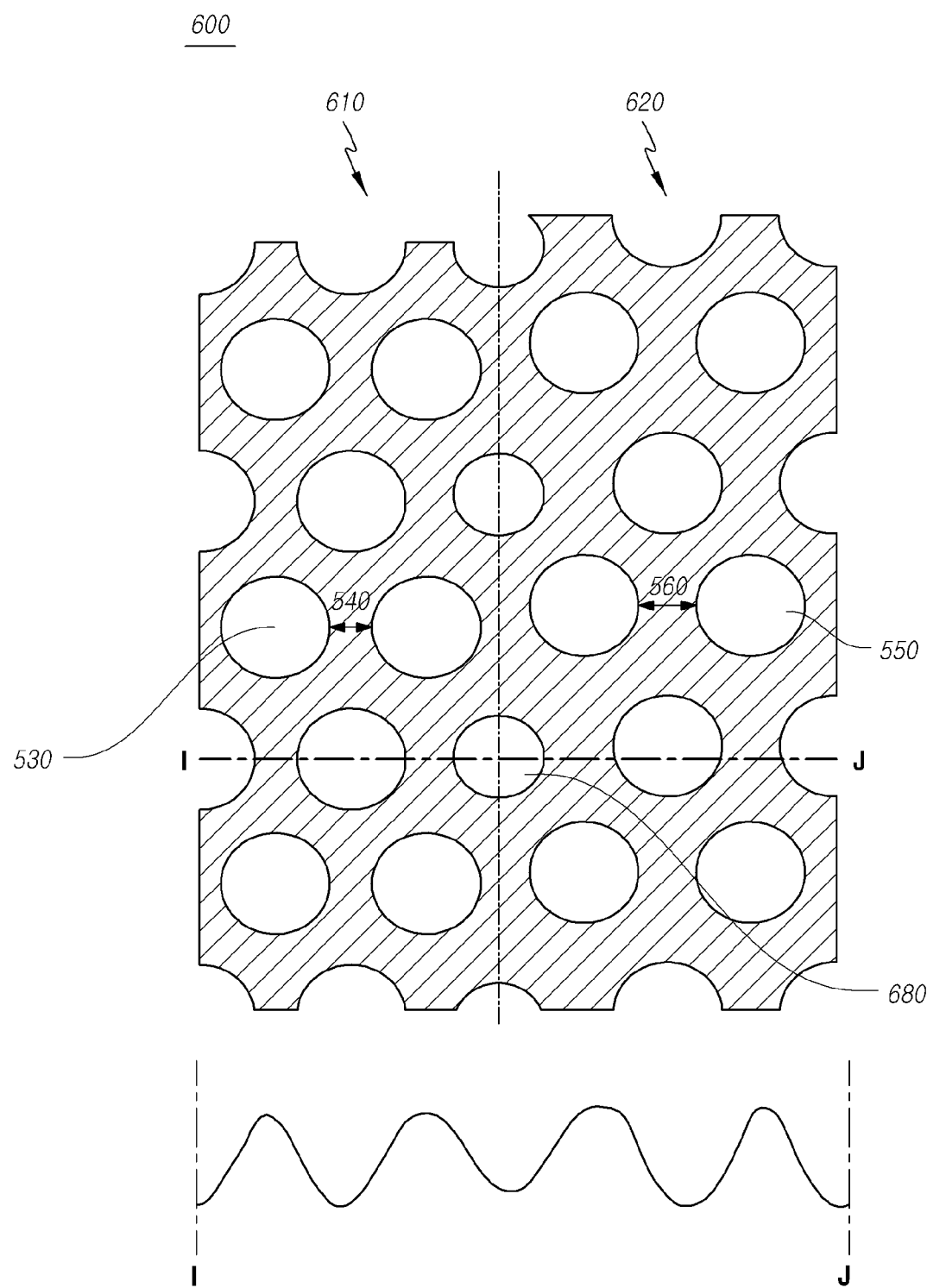
FIG. 11 illustrates a mask for forming microlenses according to a second exemplary embodiment.

In addition, the mask used in forming microlenses in the organic light-emitting display device according to exemplary embodiments is not limited to the configuration illustrated in FIG. 10, but may have a configuration illustrated in FIG. 11. FIG. 11 illustrates a mask according to a second exemplary embodiment.

The mask according to the second exemplary embodiment may include the same components as those of the foregoing embodiment. Descriptions of components in common with other embodiments will be omitted for brevity. In addition, the same reference numerals or signs will be used to designate the same or like components in each of the embodiments Referring to FIG. 11, in the mask 600 according to the second exemplary embodiment, third patterns 680 are disposed in a boundary area between a first area 610 and a second area 620 of the mask 600, unlike the mask 500 according to the first exemplary embodiment. The diameter of the third patterns 680 differs from the diameter of the first patterns 530 and the diameter of the second patterns 550. This feature can reduce pitch differences at the boundary between the first area 610 and the second area 620.

The diameter of the third patterns 680 is smaller than the diameter of either the first patterns 530 or the second patterns 550. However, the relationship of the diameters of the first to third patterns 530, 550, and 680 of the mask 600 according to the second exemplary embodiment is not limited thereto.

The third patterns 680 are disposed in the boundary area between the first area 610 and the second area 620 of the mask 600, and portions of the material of the overcoat layer are developed and removed when irradiated with light to form the first to third patterns 530, 550, and 680 of the mask 600 as open areas, and concave portions of microlenses can be formed in the portions of the overcoat disposed to correspond to the first to third patterns 530, 550, and 680 (see the cross-section along line I-J in FIG. 11).

Since the masks 500 and 600 for forming microlenses are configured as in FIG. 10 and FIG. 11, different microlenses can be formed in a single emission area.

In the organic light-emitting display device and the method of fabricating the same according to the present disclosure, microlenses having different shapes are disposed in a single emission area to compensate for the process margins of the microlenses, thereby preventing non-uniform luminance in an emission area.

The features, structures, and effects described in the present disclosure are included in at least one embodiment but are not necessarily limited to a particular embodiment. A person skilled in the art can apply the features, structures, and effects illustrated in the particular embodiment to another embodiment by combining or modifying such features, structures, and effects. It should be understood that all such combinations and modifications are included within the scope of the present disclosure.

Although the exemplary embodiments of the present disclosure have been described for illustrative purposes, a person skilled in the art will appreciate that various modifications and applications are possible without departing from the essential characteristics of the present disclosure. For example, the specific components of the exemplary embodiments may be variously modified.

What is claimed is:

1. An organic light-emitting display comprising:
a substrate;
a subpixel on the substrate and including a single light-emitting area;
an overcoat layer in the single light-emitting area of the subpixel;
a plurality of microlenses formed on an upper surface of the overcoat layer; and
an organic electroluminescent device on the plurality of microlenses,
wherein the plurality of microlenses includes a plurality of concave portions and a plurality of connecting portions connecting two adjacent concave portions,
wherein the single light-emitting area includes a first emission portion and a second emission portion spatially separated from the first emission portion,
wherein the plurality of microlenses are positioned in the first emission portion and the second emissions portion, and
wherein, between a center of two adjacent concave portions in a plan view, a width of at least one of the plurality of connecting portions positioned in the first emission portion is different from a width of at least one of the plurality of connecting portions positioned in the second emission portion.

2. The organic light-emitting display device according to claim 1, wherein a surface shape of the overcoat layer disposed on the single light-emitting area is asymmetric with respect to a virtual line between the first emission portion and the second emission portion.

3. The organic light-emitting display device according to claim 1, wherein the plurality of concave portions comprises:
a plurality of first concave portions in the first emission portion and having a first diameter; and
a plurality of second concave portions in the second emission portion and having a second diameter which is greater than the first diameter.

4. The organic light-emitting display device according to claim 3, wherein, between the center of two adjacent concave portions in a plan view, the width of the at least one of the plurality of connecting portions positioned in the second emission portion is greater than the width of the at least one of the plurality of connecting portions positioned in the first emission portion.

5. The organic light-emitting display device according to claim 1,
wherein each of the first emission portion and the second emission portion comprises a first lens area and a second lens area spatially separated from the first lens area, and
wherein, between the center of two adjacent concave portions in a plan view, a width of the at least one of the plurality of connecting portions positioned in the second lens area is different from a width of the at least one of the plurality of connecting portions positioned in the first lens area.

6. The organic light-emitting display device according to claim 5, wherein the first lens area of the first emission portion and the second lens area of the second emission portion are located diagonally in the single light-emitting area, and/or
wherein, between the center of two adjacent concave portions in a plan view, the width of the at least one of the plurality of connecting portions positioned in the second lens area of the first emission portion is greater than the width of the at least one of the plurality of connecting portions positioned in the first lens area of the first emission portion, and the width of the at least one of the plurality of connecting portions positioned in the first lens area of the second emission portion is greater than a width of the at least one of the plurality of connecting portions positioned in the second lens area of the second emission portion.

7. The organic light-emitting display device according to claim 6, wherein the plurality of concave portions comprises:
a plurality of first concave portions in each of the first lens area of the first emission portion and the second lens area of the second emission portion, and having a first diameter; and
a plurality of second concave portions in each of the second lens area of the first emission portion and the first lens area of the second emission portion, and having a second diameter which is greater than the first diameter.

8. The organic light-emitting display device according to claim 1, wherein each of the first emission portion and the second emission portion comprises a first lens area and a second lens area spatially separated from the first lens area, and wherein, between the center of two adjacent concave portions in a plan view, a width of the at least one of the plurality of connecting portions positioned in the second lens area of the first emission portion is same as a width of the at least one of the plurality of connecting portions positioned in the first lens area of the second emission portion, and a width of the at least one of the plurality of connecting portions positioned in the first lens area of the first emission portion is different from a width of the at least one of the plurality of connecting portions positioned in the second lens area of the second emission portion.

9. The organic light-emitting display device according to claim 8, wherein the first lens area of the first emission portion and the second lens area of the second emission portion are located diagonally in the single light-emitting area, and/or wherein, between the center of two adjacent concave portions in a plan view, the width of the at least one of the plurality of connecting portions positioned in the first lens area of the first emission portion is greater than the width of the at least one of the plurality of connecting portions positioned in the second lens area of the first emission portion, and/or wherein, between the center of two adjacent concave portions in a plan view, the width of the at least one of the plurality of connecting portions positioned in the first lens area of the second emission portion is greater than the width of the at least one of the plurality of connecting portions positioned in each of the second lens area of the second emission portion.

10. The organic light-emitting display device according to claim 1, wherein a first full width at half maximum of the at least one of the plurality of connecting portions positioned in the first emission portion is smaller than a second full width at half maximum of the at least one of the plurality of connecting portions positioned in the second emission portion, and wherein the first full width at half maximum and the second full width at half maximum are a length of the connecting portion at half of the maximum height of a length from a bottom of the concave portions to a top of the connecting portion.

11. An organic light-emitting display device comprising:
a substrate;
a subpixel on the substrate and including a single light-emitting area;
an overcoat layer in the single light-emitting area of the subpixel;
a plurality of first microlenses and a plurality of second microlenses formed on an upper surface of the overcoat layer and each of the plurality of first microlenses and the plurality of second microlenses having a hexagonal shape in a plan view; and
an organic electroluminescent device on the plurality of first microlenses and the plurality of second microlenses,
wherein the single light-emitting area comprises a first emission portion including the plurality of first microlenses, and a second emission portion spatially separated from the first emission portion and including the plurality of second microlenses, and wherein a size of the hexagonal shape of each of the plurality of first microlenses differs from a size of the hexagonal shape of each of the plurality of second microlenses.

12. The organic light-emitting display device according to claim 11, wherein the size of the hexagonal shape of each of the plurality of first microlenses is greater than the size of the hexagonal shape of each of the plurality of second microlenses.

13. The organic light-emitting display device according to claim 11, wherein each of the first emission portion and the second emission portion comprises a first lens area and a second lens area spatially separated from the first lens area, wherein the plurality of first microlenses are disposed in each of the first lens area of the first emission portion and the second lens area of the second emission portion, and wherein the plurality of second microlenses are disposed in each of the second lens area of the first emission portion and the first lens area of the second emission portion.

14. The organic light-emitting display device according to claim 11, wherein the plurality of first microlenses and the plurality of second microlenses include a plurality of concave portions and a plurality of connecting portions connecting two adjacent concave portions, wherein each of the plurality of concave portions is surrounded by the plurality of connecting portions, and wherein the plurality of connecting portions surrounding each of the plurality of concave portions has a hexagonal shape in a plan view.

15. The organic light-emitting display device according to claim 11, wherein the plurality of first microlenses and the plurality of second microlenses include a plurality of concave portions and a plurality of connecting portions connecting two adjacent concave portions, and wherein, between a center of two adjacent concave portions in a plan view, a width of at least one of the plurality of connecting portions of the plurality of second microlenses is different from a width of at least one of the plurality of the connecting portions of the plurality of first microlenses.

16. The organic light-emitting display device according to claim 15, wherein, between the center of two adjacent concave portions in a plan view, the width of the at least one of the plurality of connecting portions of the plurality of second microlenses is greater than the width of the at least one of the plurality of the connecting portions of the plurality of first microlenses.

17. The organic light-emitting display device according to claim 11, further comprising a plurality of third microlenses formed on the upper surface of the overcoat layer and each of the plurality of third microlenses having a hexagonal shape in a plan view, wherein a size of the hexagonal shape of each of the plurality of third microlenses differs from the size of the hexagonal shape of each of the plurality of first microlenses and each of the plurality of second microlenses.

18. The organic light-emitting display device according to claim 17, wherein the size of the hexagonal shape of each of the plurality of first microlenses is greater than the size of the hexagonal shape of each of the plurality of second microlenses, and wherein the size of the hexagonal shape of each of the plurality of the second microlenses is greater than the size of the hexagonal shape of each of the plurality of third microlenses.

19. The organic light-emitting display device according to claim 17, wherein the plurality of first microlenses, the plurality of second microlenses, and the plurality of third microlenses include a plurality of concave portions and a plurality of connecting portions connecting two adjacent concave portions, and wherein, between a center of two adjacent concave portions in a plan view, a width of at least one of the plurality of connecting portions of the plurality of first microlenses, a width of at least one of the plurality of connecting portions of the plurality of second microlenses, and a width of at least one of the plurality of connecting portions of the plurality of third microlenses are different from each other.

20. The organic light-emitting display device according to claim 19, wherein, between the center of two adjacent concave portions in a plan view, the width of the at least one of the plurality of connecting portions of the plurality of second microlenses is greater than the width of the at least one of the plurality of the connecting portions of the plurality of first microlenses, and the width of the at least one of the plurality of connecting portions of the plurality of third microlenses is greater than the width of the at least one of the plurality of the connecting portions of the plurality of second microlenses.

* * * * *